United States Patent
Zhao

(10) Patent No.: US 10,991,577 B2
(45) Date of Patent: Apr. 27, 2021

(54) METHOD FOR FORMING A SEMICONDUCTOR STRUCTURE FOR A GALLIUM NITRIDE CHANNEL DEVICE

(71) Applicant: IMEC VZW, Leuven (BE)

(72) Inventor: Ming Zhao, Bertem (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 16/194,904

(22) Filed: Nov. 19, 2018

(65) Prior Publication Data

US 2019/0157081 A1    May 23, 2019

(30) Foreign Application Priority Data

Nov. 20, 2017 (EP) ................................ 17202492

(51) Int. Cl.
*H01L 29/06* (2006.01)
*H01L 31/072* (2012.01)
(Continued)

(52) U.S. Cl.
CPC .... *H01L 21/02507* (2013.01); *H01L 21/0254* (2013.01); *H01L 21/0262* (2013.01);
(Continued)

(58) Field of Classification Search
CPC ............. H01L 29/0607; H01L 29/1075; H01L 29/2003; H01L 21/02507; H01L 21/0254;
(Continued)

(56) References Cited

U.S. PATENT DOCUMENTS 8,410,472 B2   4/2013   Ikuta et al.
8,410,525 B2   4/2013   Sato
(Continued)

FOREIGN PATENT DOCUMENTS

EP   2360719 A1   8/2011
EP   2709170 A2   3/2014
(Continued)

OTHER PUBLICATIONS

European Search Report, European Patent Application 17202492.9, dated May 29, 2018, 6 pages.

*Primary Examiner* — Brian Turner
(74) *Attorney, Agent, or Firm* — McDonnell Boehnen Hulbert & Berghoff LLP

(57) ABSTRACT

A method of forming a semiconductor structure for a III-N semiconductor channel device and a device produced by the method are disclosed. The method includes: (i) forming a buffer structure on a Si-substrate, wherein forming the buffer structure includes: forming a superlattice including at least one superlattice block, each superlattice block including a repetitive sequence of superlattice units, each superlattice unit including a first layer and a second layer formed on the first layer, wherein the first layer is a carbon-doped $Al_xGa_{1-x}N$ layer and the second layer is a carbon-doped $Al_yGa_{1-y}N$ layer, wherein x and y differ from each other and $0 \le x \le 1$, $0 \le y \le 1$, and wherein said at least first and second layers are epitaxially grown at a temperature of 980° C. or lower, and (ii) forming a III-N semiconductor channel layer above the buffer structure wherein the channel layer is epitaxially grown at a temperature of 1040° C. or lower and is grown to a thickness of 1 µm or smaller.

15 Claims, 12 Drawing Sheets

(51) Int. Cl.
*H01L 29/12* (2006.01)
*H01L 31/0336* (2006.01)
*H01L 21/02* (2006.01)
*H01L 29/66* (2006.01)
*H01L 29/778* (2006.01)

(52) U.S. Cl.
CPC .. *H01L 21/02381* (2013.01); *H01L 21/02458* (2013.01); *H01L 21/02579* (2013.01); *H01L 29/66462* (2013.01); *H01L 29/7787* (2013.01)

(58) Field of Classification Search
CPC ............... H01L 29/155; H01L 29/0684; H01L 21/02458; H01L 21/0262; H01L 29/207; C23C 16/303; C30B 29/68; C30B 25/02
See application file for complete search history.

(56) References Cited

U.S. PATENT DOCUMENTS

| | | | |
|---|---|---|---|
| 9,245,993 B2 | 1/2016 | Keller et al. | |
| 9,608,075 B1 | 3/2017 | Wan et al. | |
| 2010/0109018 A1 | 5/2010 | Chen et al. | |
| 2011/0049573 A1* | 3/2011 | Hashimoto | H01L 21/02661 257/201 |
| 2011/0240962 A1* | 10/2011 | Ikuta | H01L 29/66462 257/15 |
| 2012/0261716 A1* | 10/2012 | Yanagihara | H01L 29/155 257/190 |
| 2013/0020581 A1 | 1/2013 | Teraguchi et al. | |
| 2013/0075786 A1* | 3/2013 | Ishiguro | H01L 21/0254 257/194 |
| 2013/0168734 A1* | 7/2013 | Miyoshi | H01L 29/66462 257/190 |
| 2013/0181188 A1* | 7/2013 | Ooshika | H01L 29/15 257/13 |
| 2014/0008661 A1 | 1/2014 | Iwami et al. | |
| 2014/0015608 A1 | 1/2014 | Kotani et al. | |
| 2015/0357419 A1* | 12/2015 | Lutgen | H01L 21/0251 257/22 |
| 2016/0099345 A1 | 4/2016 | Ramer et al. | |
| 2016/0149000 A1 | 5/2016 | Sazawa | |
| 2016/0240679 A1* | 8/2016 | Chen | H01L 29/7849 |
| 2017/0033209 A1 | 2/2017 | Sato et al. | |
| 2017/0069721 A1* | 3/2017 | Linthicum | H01L 21/02378 |
| 2017/0170283 A1* | 6/2017 | Laboutin | H01L 29/2003 |
| 2017/0256407 A1* | 9/2017 | Tajiri | C23C 16/301 |

FOREIGN PATENT DOCUMENTS

| | | |
|---|---|---|
| EP | 2767620 A1 | 8/2014 |
| EP | 2709170 A3 | 3/2015 |
| JP | 2000-068498 A | 3/2000 |
| JP | 2010-171416 A | 8/2010 |
| JP | 5224311 B2 | 7/2013 |
| WO | 2017/002317 A1 | 1/2017 |

* cited by examiner

METHOD FOR FORMING A SEMICONDUCTOR STRUCTURE FOR A GALLIUM NITRIDE CHANNEL DEVICE

CROSS-REFERENCE

This application claims priority from European patent application serial no. 17202492.9, filed Nov. 20, 2017, which is incorporated by reference in its entirety.

TECHNICAL FIELD

The present disclosure relates to a method for forming a semiconductor structure for a III-N semiconductor channel device.

BACKGROUND

III-N semiconductors, such as gallium nitride (GaN), are promising candidates for fabrication of advanced semiconductor devices. Owing to their relatively wide band gap, III-N semiconductor devices are of particular interest for use in high power and high frequency applications, such as radio frequency (RF) circuitry with high power density. III-N semiconductor structures are typically grown by epitaxy on silicon carbide (SiC) substrates. SiC substrates allows forming of structures presenting high thermal conductivity and low RF loss. However, SiC substrates are comparably expensive and also challenging to scale up to greater wafer sizes. 6 inch SiC wafers are commercially available but are relatively costly. To enable large-scale cost-efficient fabrication of III-N semiconductor devices, attempts have been made to replace SiC substrate with high resistive Si-substrates, which presently are available in diameters up to 12 inches.

Although considerable progress has been made in epitaxy techniques for III-N-on-Si technology, it is still challenging to provide III-N semiconductor structures meeting the many requirements in for instance high power and RF electronics. There is hence room for improvement over state of the art processes for forming III-N semiconductor structures.

SUMMARY

An objective of the present disclosure is to provide an improvement over prior art techniques for forming III-N semiconductor structures suitable for high power and/or RF applications. Further and alternative objectives may be understood from the following.

According to an aspect of the present disclosure, a method of forming a semiconductor structure for a III-N semiconductor channel device is provided. The method comprises:

forming a buffer structure on a Si-substrate, wherein forming the buffer structure includes:

forming a superlattice including at least one superlattice block, each superlattice block including a repetitive sequence of superlattice units, each superlattice unit including a first layer and a second layer formed on the first layer, wherein the first layer is a carbon-doped $Al_xGa_{1-x}N$ layer and the second layer is a carbon-doped $Al_yGa_{1-y}N$ layer, wherein x and y differ from each other and $0 \leq x \leq 1$, $0 \leq y \leq 1$, and wherein said at least first and second layers are epitaxially grown at a temperature of 980° C. or lower; and forming a III-N semiconductor channel layer above the buffer structure wherein the channel layer is epitaxially grown at a temperature of 1040° C. or lower and is grown to a thickness of 1 µm or smaller.

The present disclosure enables forming of a semiconductor structure for a III-N semiconductor channel device with improved properties, i.e. a semiconductor structure for a device having an active channel including one or more group III-N semiconductors.

It has been realized that an appreciable amount of high frequency (e.g. at switching frequencies on the order of Gigahertz and higher) transmission losses in current III-N-on-Si devices can be due to Eddy currents generated in a parasitic conducting channel formed in the Si-substrate near the interface between the III-N semiconductor and Si-substrate. The parasitic channel may be attributed to significant in-diffusion of aluminum (Al), gallium (Ga) and/or other group III elements into the Si-substrate during the epitaxial growth of the III-N semiconductor, which may be typically performed at a high temperature of over 1050° C. for a duration extending up to several hours. This translates to a high thermal budget growth process which can drive the group III semiconductors in-diffusion, which in turn may tend to create a p-type doped parasitic layer. The present disclosure allows a semiconductor structure for a III-N semiconductor channel device to be formed within a limited total thermal budget.

Incorporation of the buffer structure, as claimed, enables a reduced group III semiconductor diffusion into the Si-substrate. The buffer structure further allows epitaxial growth of a high quality III-N semiconductor channel layer at a comparably low temperature of 1040° C. or lower. Meanwhile, as the layers of each of the one or more superlattice blocks can be grown at a temperature of 980° C. or lower, the total thermal budget of the semiconductor structure may be limited. Controlling the total thermal budget in this manner can allow diffusion of group III semiconductor into the Si-substrate to be further reduced.

Moreover, growth temperatures of 980° C. or lower of the layers of the superlattice units of each superlattice block, can enable an incorporation of carbon (C) atoms into the layers of the superlattice. In other words, the epitaxial growth process of the first layer and the epitaxial growth process of the second layer can be adapted such that the first layer and the second layer can be formed as carbon doped layers. This process, which may be referred to as "auto C doping", may lead to an increased electric resistance of the superlattice and hence improved buffer leakage blocking capabilities. In other words, the lower temperature growth process of the layers of the superlattice units of the superlattice layers can provide a double function of enabling reduced diffusion (and accordingly reduced RF switching losses) and improved buffer leakage blocking capabilities.

The buffer structure can enable a reduced buffer dispersion. Controlling the C doping concentration in the buffer structure can allow introduction of a high density of deep levels within the bandgap wherein firm pinning of the Fermi level at the deep levels may result. This may mitigate the charge trapping and de-trapping effects and therefore reduce the buffer dispersion.

The buffer structure can further enable tensile and compressive strain to be alternatingly introduced into the structure in a controlled manner by varying the composition and thickness of the layers of the superlattice units of the one or more superlattice blocks. This allows "compliant buffering" such that the strain introduced by lattice mismatch and thermal mismatch between III-N semiconductor and Si may be managed. Layer cracking and wafer warp may thereby be kept under control.

In the present disclosure, when a temperature or temperature range is indicated, the temperature refers to the surface temperature of the Si-substrate or other already formed layers of the semiconductor structure. The temperature may be monitored for instance using an infrared pyrometer.

The at least first and second layers of each superlattice unit of each superlattice block may be epitaxially grown at a temperature of 980° C. or lower. A lower growth temperature may further reduce the overall thermal budget of the method while increasing the auto C doping of the buffer structure.

Each superlattice unit of said at least one superlattice block may further include at least a third layer formed on the second layer, wherein the third layer may be an $Al_zGa_{1-z}N$ layer, where z differs from x and y and $0 \leq z \leq 1$. Each superlattice unit may accordingly include, in a bottom-up direction, the first layer, the second layer and the third layer. Increasing the number of layers of the superlattice units provides an increased degree of freedom in tuning the buffer structure properties, among others for the purpose of controlling wafer warp.

Each one of the layers of said superlattice units may be grown by metal-organic chemical vapor deposition (MOCVD), also known as metal-organic vapor phase epitaxy (MOVPE). MOCVD enables high quality layer growth. The metal organic precursors used in MOCVD can allow auto C doping without any separate carbon source.

The C-doping concentration in each one of the layers of each superlattice unit of each superlattice block may generally be $10^{19}$ cm$^{-3}$ or higher, and usually not higher than $10^{20}$ cm$^{-3}$. This can enable strong buffer leakage blocking capabilities, while limiting degradation of material quality.

In addition, a C doping concentration of $10^{19}$ cm$^{-3}$ or higher may introduce a high density of deep levels within the bandgap wherein firm pinning of the Fermi level at the deep levels can result (for instance about 0.9 eV above the valence band in GaN). Because of the Fermi level pinning, charge trapping and de-trapping effects can be suppressed, and consequently the buffer dispersion effect may also be suppressed.

The superlattice unit may include at least two superlattice blocks wherein an average Al concentration of each superlattice block may be gradually decreased along the stacking direction. This can allow compressive strain to be gradually introduced to compensate for tensile strain introduced by thermal mismatch between the III-N semiconductor and the Si-substrate.

The buffer structure may further be formed such that an at least partial strain relaxation occurs between at least one adjacent pair of layers of at least one of said at least one or said at least two superlattice blocks. The strain relaxation may be of any degree within a range of partial to full strain relaxation. By strain relaxation is hereby meant relaxation of the in-plane strain. Having an at least partial strain relaxation between two mutually abutting layers enables the buffer structure to be formed with a greater thickness: During growth of the buffer structure compressive strain may accumulate and an in situ curvature of the Si-substrate may increase. If the in situ curvature is increased beyond a critical amount (the precise value being base substrate specific), plastic deformation of the base substrate may occur. By having an at least partial strain relaxation in at least one superlattice block, the rate of increase of the in situ curvature may be reduced such that a thicker buffer layer structure may be formed without reaching the limit for plastic deformation.

Adjacent pairs of layers of the one or more superlattice blocks, other than said adjacent pair of at least partially strain relaxed layers, may be pseudomorphic layers. By a pseudomorphic layer pair is hereby meant a pair of a lower layer and an upper layer wherein the (in-plane) lattice constant of the upper layer matches the (in-plane) lattice constant of the lower layer.

A superlattice block may be formed with a thickness at which the compressive stress starts to relax, which corresponds to the thickness where the slope of the substrate or wafer in situ curvature appreciably decreases. Especially, growth of at least one of said one or more superlattice blocks may be continued at least until the slope of the in situ wafer curvature drops below 0.015 km$^{-1}$/s$_{[AVG1]}$.

Each layer of each superlattice unit may be formed with a thickness less than 100 nm thick. Thereby lattice mismatch-introduced strain may be maintained throughout the buffer structure.

The channel layer may include a combination of one or more group III semiconductor species and N. The channel layer may be formed of $B_xIn_yAl_zGa_wN$ ($0 \leq x \leq 1$, $0 \leq y \leq 1$; $0 \leq z \leq 1$, $0 \leq w \leq 1$, and $x+y+z+w=1$).

The channel layer may be formed with a thickness in the range of 0.1 to 1 μm. Typically, a reduced channel layer thickness could result in a channel layer of inferior quality. However, it has been realized that, by virtue of the buffer structure, a reduced thickness channel layer (1 μm or less) may be grown while maintaining a sufficient material quality. A reduced thickness channel layer may further reduce the total thermal budget for forming the semiconductor structure and hence can enable a further reduction of group III diffusion into the Si-substrate.

The channel layer may advantageously be epitaxially grown at a temperature in the range of 1010° C. to 1040° C. A growth temperature in this range promotes formation of a high quality III-N semiconductor channel layer while keeping the thermal budget under control.

The channel layer may be grown at a growth rate of 0.6 nm/s or greater. By adapting the epitaxial growth of the channel layer to yield such a growth rate of the channel layer, the total thermal budget may be further decreased.

The channel layer may be grown by MOCVD. MOCVD can enable high quality layer growth. The elevated growth temperature of the channel layer, compared to the growth temperature of the layers of the superlattice, may decrease the background impurities, including C-doping, in the channel layer and increase the crystalline quality. This makes it possible to obtain a high electron mobility inside the channel layer.

The forming of the buffer structure may further comprise forming of a lower transition layer of (Al)GaN, wherein the superlattice may be formed on the lower transition layer. The lower transition layer may provide an additional flexibility in wafer warp control and may also provide a foundation for higher material quality growth of the superlattice on top.

The notation (Al)GaN should herein be understood as $Al_iGa_{1-i}N$, where $0 \leq i \leq 1$. If the (Al)GaN notation is used for different layers, it should be understood that different layers may present different compositions, i.e. different values of i.

The lower transition layer may be a single layer with a uniform composition or be a composite layer including two or more sub-layers of (Al)GaN with different compositions. In any case, a total thickness of the lower transition layer may advantageously be 200 nm or less. The lower transition layer may advantageously be grown at a temperature of 1010° C. or lower.

The forming of the buffer structure may further comprise forming of an upper transition layer of (Al)GaN on the superlattice. The upper transition layer may provide an additional flexibility in wafer warp control and may also provide a foundation for higher material quality growth of the channel layer on top.

The upper transition layer may be a single layer with a uniform composition or be a composite layer including two or more sub-layers of (Al)GaN with different compositions. In any case, a total thickness of the upper transition layer may advantageously be 1500 nm or less.

The upper transition layer may be grown at a temperature of 980° C. or lower, generally 950° C. or lower. This enables the total thermal budget to be limited. Also, a reduced growth temperature may as explained above promote C-doping of the grown layer.

In correspondence with the above discussion of the auto C doping of the layers of the superlattice, the epitaxial growth process of the upper transition layer may accordingly also be adapted such that the upper transition layer may be formed as a C-doped layer. This may further improve the overall buffer leakage blocking capabilities of the buffer structure.

The C-doping concentration of the upper transition layer may be $10^{19}$ cm$^{-3}$ or higher and generally not higher than $10^{20}$ cm−3. This may enable strong buffer leakage blocking capabilities without strong degradation of material quality.

The upper transition layer may be grown by MOCVD. The metal organic precursors used in MOCVD can allow auto C doping without any separate carbon source. A lower growth temperature may further reduce the overall thermal budget of the method while increasing the auto C doping of the buffer structure.

Forming the buffer structure may further comprise forming a nucleation layer of AlN on the Si-substrate. The nucleation layer may form a bottom layer of the buffer structure. An AlN nucleation layer may prevent an eutectic reaction between Si and Ga which may lead to the so-called "melt etch back" effect. The AlN nucleation layer may also facilitate epitaxial growth of the further material layers of the buffer structure. The nucleation layer may be formed with a thickness of 250 nm or less. The nucleation layer may be epitaxially grown at a temperature of 1010° C. or lower, to promote the material quality of the layer.

The Si-substrate may present a resistivity of 500 ohm-cm or greater. This can enable a device presenting low or at least reduced RF losses.

An electron supply layer may be formed on the channel layer. The electron supply layer may be formed of BaIn$_b$Al$_c$Ga$_d$N layer, 0≤a≤1, 0≤b≤1, 0≤c≤1, 0≤d≤1 and a+b+c+d=1. In some embodiments, at least two group III elements of the electron supply layer may present different concentration than the buffer layer. The electron supply layer may be formed with a thickness of 50 nm or less.

BRIEF DESCRIPTION OF THE DRAWINGS

The above, as well as additional objects, features and advantages of the present disclosure, will be better understood through the following illustrative and non-limiting detailed description, with reference to the appended drawings. In the drawings like reference numerals will be used for like elements unless stated otherwise.

DETAILED DESCRIPTION

Figure 1:
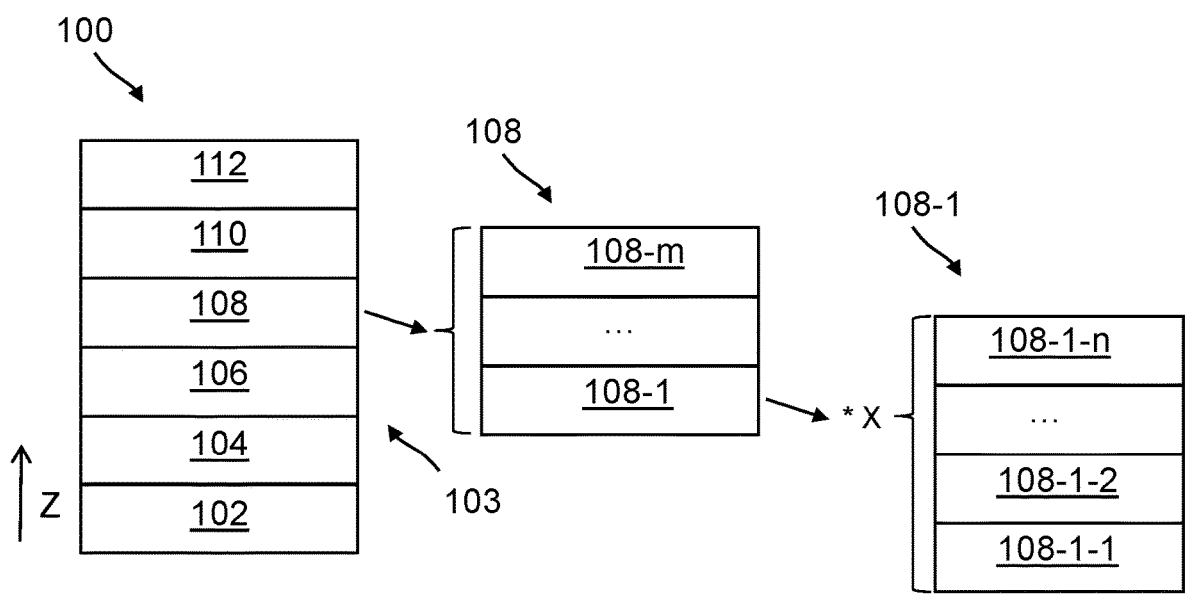
FIG. 1 schematically shows a representative semiconductor structure for a III-N semiconductor channel device.
Figure 2:
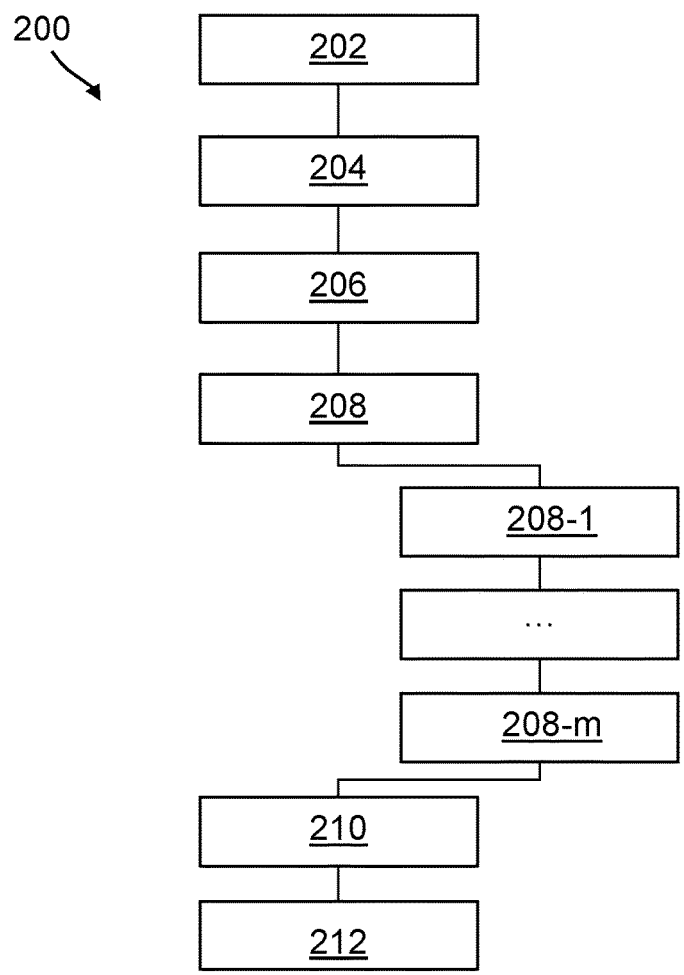
FIG. 2 shows a flow chart of a representative method for forming a semiconductor structure for a III-N semiconductor channel device.

A representative method of forming a semiconductor structure for a III-N semiconductor channel device will now be described with reference to FIGS. 1 and 2. FIG. 1 shows in cross section a semiconductor structure 100 comprising a stack of layers. The stacking direction of the layers may be indicated by "Z" and may in the following be referred to as a vertical direction. It should be noted that the relative dimensions of the shown elements, in particular the relative thickness of the layers, is merely schematic and may, for the purpose of illustrational clarity, differ from a physical structure. The semiconductor structure 100 may include in a bottom-up direction a Si-substrate 102, a buffer structure 103 and a channel layer 112.

The Si-substrate 102 may be any substrate having at least an upper Si-layer portion. The substrate 102 may, for instance, be a silicon-on-insulator (SOI) substrate or a silicon-on-AlN substrate. The substrate 102 (i.e. at least the upper portion thereof) may be formed of monocrystalline Si. The substrate 102 may be formed with a (111) plane as an upper main surface. The substrate 102 may present a resistivity of 500 ohm-cm or greater.

In accordance with the method 200, the substrate 102 may be provided (step 202). The buffer structure 103 may be formed on the substrate 102, prior to forming a channel layer 112 (steps 204-210). The buffer structure 103 may be formed on the upper main surface of the substrate 102. The buffer structure 103 can include in a bottom-up direction an AlN nucleation layer 104, an (Al)GaN lower transition layer 106, a superlattice 108 and an (Al)GaN upper transition layer 110.

The AlN nucleation layer 104 may be formed on and in contact with the upper surface of the Si-substrate 102 (step 204). The AlN nucleation layer 104 may be epitaxially grown by vapor phase deposition at a temperature of 1010° C. or lower. The nucleation layer 104 may be formed by MOCVD, or using some other conventional type of vapor deposition process suitable for epitaxial growth of an AlN nucleation layer. The nucleation layer 104 may be formed with a thickness of 250 nm or less, usually at least 50 nm. More generally, the nucleation layer 104 may be formed with a thickness which may be sufficient for counteracting diffusion of Ga to react with the Si-substrate as well as for reaching a sufficient crystalline quality for the growth of following layers. The nucleation layer 104 may be formed to present a C-plane as an upper main surface.

The (Al)GaN lower transition layer 106 may be formed on and in contact with the upper main surface of the nucleation layer 104. The lower transition layer 106 may be formed as a single layer with a uniform composition. For instance, the lower transition layer 106 may be an (Al)GaN layer having an Al content in the range of 20% to 90%. Alternatively, the lower transition layer 106 may be formed as a composite layer including two or more sub-layers of (Al)GaN with different compositions. For instance, the lower transition layer 106 may be formed as a bilayer of an $Al_{0.9}GaN$ layer (e.g. 20 nm thick) and an $Al_{0.8}GaN$ layer (e.g. 20 nm thick), stacked in the growth direction.

The (Al)GaN lower transition layer 106 may be epitaxially grown by vapor phase deposition at a temperature of 1010° C. or lower. The lower transition layer 106 may be formed by MOCVD, However, other processes suitable for (Al)GaN growth may be used, such as molecular beam epitaxy (MBE) or physical vapor deposition (PVD). The lower transition layer 106 may be formed with a (total) thickness of 200 nm or less. The lower transition layer 106 may be formed to present a C-plane as an upper main surface. Depending on the structure of the superlattice 108, described further below, the lower transition layer 106 may be omitted.

The superlattice 108 may be formed on and in contact with the upper main surface of the lower transition layer 106. The superlattice 108 may include or consist of a number m of superlattice blocks 108-1 to 108-m. Each one of the m superlattice blocks may include or consist of X number of repetitions of superlattice units, i.e. a repetitive sequence of superlattice units. The number of repetitions X may be different for the different superlattice blocks 108-1 to 108-m. The number of repetitions X may be two or more for each superlattice block 108-1 to 108-m. Each superlattice unit of a superlattice block 108-1 to 108-m may include at least two layers. The compositions of superlattice units of different superlattice blocks may be different.

Exemplifying with reference to the superlattice unit 108-1, the superlattice unit 108-1 may include at least a first layer 108-1-1 and a second layer 108-1-2 formed on and in contact with an upper main surface of the first layer 108-1-1. The first layer 108-1-1 may be a carbon-doped $Al_xGa_{1-x}N$ layer and the second layer 108-1-2 may be a carbon-doped $Al_yGa_{1-y}N$ layer, wherein x and y differ from each other and $0 \leq x \leq 1$, $0 \leq y \leq 1$. A carbon content of the first layer 108-1-1 and the second layer 108-1-2 may be $10^{19}$ cm$^{-3}$ or higher, usually not greater than $10^{20}$ cm$^{-3}$. The superlattice unit 108-1 may further include a third layer 108-1-3 formed on and in contact with an upper main surface of the second layer 108-1-2, wherein the third layer 108-1-3 may be an $Al_zGa_{1-z}N$ layer, where z differs from x and y and $0 \leq z \leq 1$. As indicated in FIG. 1, the superlattice unit 108-1 may generally include a first to an $n^{th}$ layer, each layer being a carbon-doped (Al)GaN layer with an Al- and Ga-content which may be different from adjacent lower and upper layers. Each layer 108-1-1, 108-1-2 of the superlattice unit 108-1 may be generally formed with a thickness less than 100 nm thick. The above description of the superlattice unit 108-1 applies correspondingly to the other superlattice units 108-2 to 108-m.

The number of layers of each superlattice unit, the number of repetitions of each superlattice unit of a superlattice block, as well as the number of superlattice blocks may be tailored depending on the particular requirements on the semiconductor structure.

For a superlattice 108 including more than one superlattice block, an average Al concentration of each superlattice block may be gradually decreased along the vertical direction. The layers of each superlattice unit of each superlattice block 108-1 to 108-m may be epitaxially grown by MOCVD at a temperature of 980° C. or lower. Growing the (Al)GaN layers at temperatures in this range by MOCVD can allow the layers to be automatically doped with carbon. The carbon doping concentration may be varied by controlling ambient pressure, V/III ratio (i.e. N-containing precursor and group III element-including precursors flux ratio), growth rate and/or $H_2$ and $N_2$ flow. Examples of suitable precursors for group III elements include Trimethylgallium (TMGa), Triethylgallium (TEGa) and Trimethylaluminium (TMAl). Carbon doping may also be achieved by adding a carbon-source to the growth chamber, such as methane ($CH_4$), ethylene ($C_2H_4$), acetylene ($C_2H_2$), propane ($C_3H_8$) or iso-butane ($i-C_4H_{10}$).

The (Al)GaN upper transition layer 110 may be formed on and in contact with the upper main surface of the superlattice 108. The upper transition layer 110 may be formed as a single layer with a uniform composition. For instance, the upper transition layer 110 may be an (Al)GaN layer having an Al content in the range of 0% to 20%. Alternatively, the upper transition layer 110 may be formed as a composite layer including two or more sub-layers of (Al)GaN with different compositions. For instance, the upper transition layer 110 may be formed by a bilayer of an AlGaN layer with an Al content in the range of 5% to 20%, and a GaN layer. In any case, the upper transition layer 110 may be formed as a carbon-doped layer, with a carbon content in the range of $10^{19}$ cm$^{-3}$ to $10^{20}$ cm$^{-3}$.

The upper transition layer 110 may be epitaxially grown by MOCVD at a temperature of 980° C. or lower. Growing the upper transition layer 110 at a temperature in this range by MOCVD can allow the upper transition layer 110 to be automatically doped with carbon. As mentioned above, examples of suitable precursors for group III elements may include TMGa, TEGa and TMAl. As noted above, carbon doping may also be achieved by adding a separate carbon-source to the growth chamber.

The upper transition layer 110 may be formed with a (total) thickness of 1500 nm or less. The upper transition layer 110 may be formed to present a C-plane as an upper main surface. Depending on the structure of the superlattice 108, the upper transition layer 110 may be omitted.

The III-N semiconductor channel layer 112 may be formed on and in contact with the upper main surface of the buffer structure 108 (either the upper main surface of the upper transition layer 110 or the upper main surface of the superlattice 108).

The channel layer may be formed of $B_xIn_yAl_zGa_wN$ ($0≤x≤1, 0≤y≤1; 0≤z≤1, 0≤w≤1$, and $x+y+z+w=1$). The channel layer 112 may be epitaxially grown by MOCVD using precursors for group III elements of trimethylindium (TMIn) and triethylboron (TEB), TMGa, TEGa and TMAl. The channel layer 112 may be grown at a temperature of 1040° C. or lower, usually in the range of 1010° C. to 1040° C. To further suppress C-doping (if using MOCVD) the ambient pressure, V/III ratio, growth rate and/or $H_2$ and $N_2$ flow may be controlled. It may be also possible to use other types of deposition processes allowing epitaxial growth of a III-N material. The channel layer may be grown at a growth rate of 0.6 nm/s or greater to a total thickness in the range of 0.1 to 1 μm.

Subsequent to forming the channel layer 112, further layers and structures may be formed on the semiconductor structure 100 in order to form a complete device. For instance, an electron supply layer (not shown in FIG. 1) may be formed on the channel layer 112. The electron supply layer may be formed of a $BaIn_bAl_cGa_dN$ layer ($0≤a≤1, 0≤b≤1, 0≤c≤1, 0≤d≤1$ and $a+b+c+d=1$) having a different composition than the channel layer 112. The electron supply layer may be formed with a thickness of 50 nm or less. A spacer layer (e.g. of AlN) may be formed between the channel layer 112 and the electron supply layer. A cap layer, such as a GaN layer or $Si_3N_4$ layer, may be formed on top of the electron supply layer. The spacer layer, the electron supply layer and the cap layer may be formed using a same deposition technique as for the channel layer 112. Source, drain and gate electrodes may be formed on the electron supply layer (or the cap layer if present) in a conventional manner.

Figure 3A:
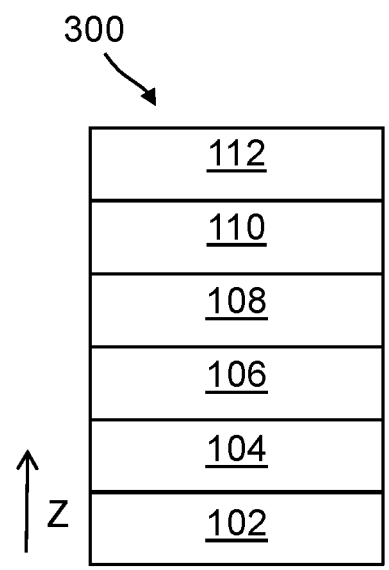
FIG. 3a shows an example semiconductor structure.

FIG. 3a shows an example semiconductor structure 300 comprising a 200 mm Si-substrate 102 with a (111) upper surface plane and a resistivity of 500-2000 Ω-cm. The buffer structure may include a 200 nm thick AlN nucleation layer 104 and a 100 nm AlGaN transition layers which may include, along the growth direction, 10 nm $Al_{0.9}GaN$, 10 nm $Al_{0.8}GaN$, 10 nm $Al_{0.7}GaN$, 10 nm $Al_{0.6}GaN$, 10 nm $Al_{0.5}GaN$, 10 nm $Al_{0.4}GaN$ and 40 nm $Al_{0.3}GaN$. The buffer structure may include a superlattice 108 including a repetition of 100 superlattice units of [5 nm AlN/28 nm $Al_{0.1}GaN$] having a carbon concentration of about $2E19$ $cm^{-3}$, and may be grown at 940° C. by MOCVD. The buffer structure may include an upper transition layer 110 of 1.5 μm C—GaN (C—GaN denoting "carbon-doped GaN") with a carbon concentration of about $2E19$ $cm^{-3}$, and grown by MOCVD at 950° C. Finally, a 300 nm GaN channel layer 112 may be grown at 1040° C. by MOCVD on the buffer structure.

Figure 3B:
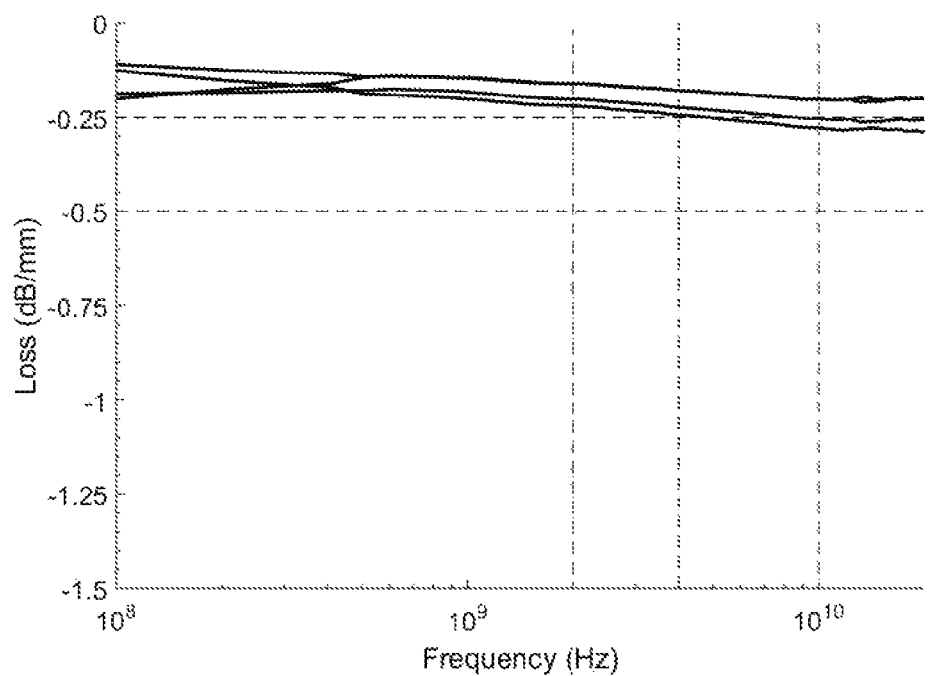
FIG. 3b shows a plot where each curve was obtained from different example semiconductor structures with similar configuration formed on a sample substrate.

The wafer warp post epitaxial growth may be as small as 70 μm and the epi-grown layers can be substantially free from cracks. The RF transmission loss of this structure was characterized using S parameter measurement on co-planar waveguide structures fabricated on the epi stack. As shown in FIG. 3b, the loss can be less than approximately −0.25 dB/mm at 20 GHz. Each curve in the plot was obtained from different semiconductor structures with similar configuration, formed on the sample substrate 102. The reduced RF loss may be explained by a limited Al and Ga in-diffusion into the Si-substrate 102, as indicated by the Secondary Ion Mass Spectrometry (SIMS) results shown in FIG. 3c where the Al and Ga chemical concentration profile are plotted near the Si/AlN interface. As may be seen, both Al and Ge concentrations can drop abruptly and approach the SIMS detection limit after about 43.8 nm into the Si-substrate 102, in a direction from the Si/AlN interface.

Figure 3C:
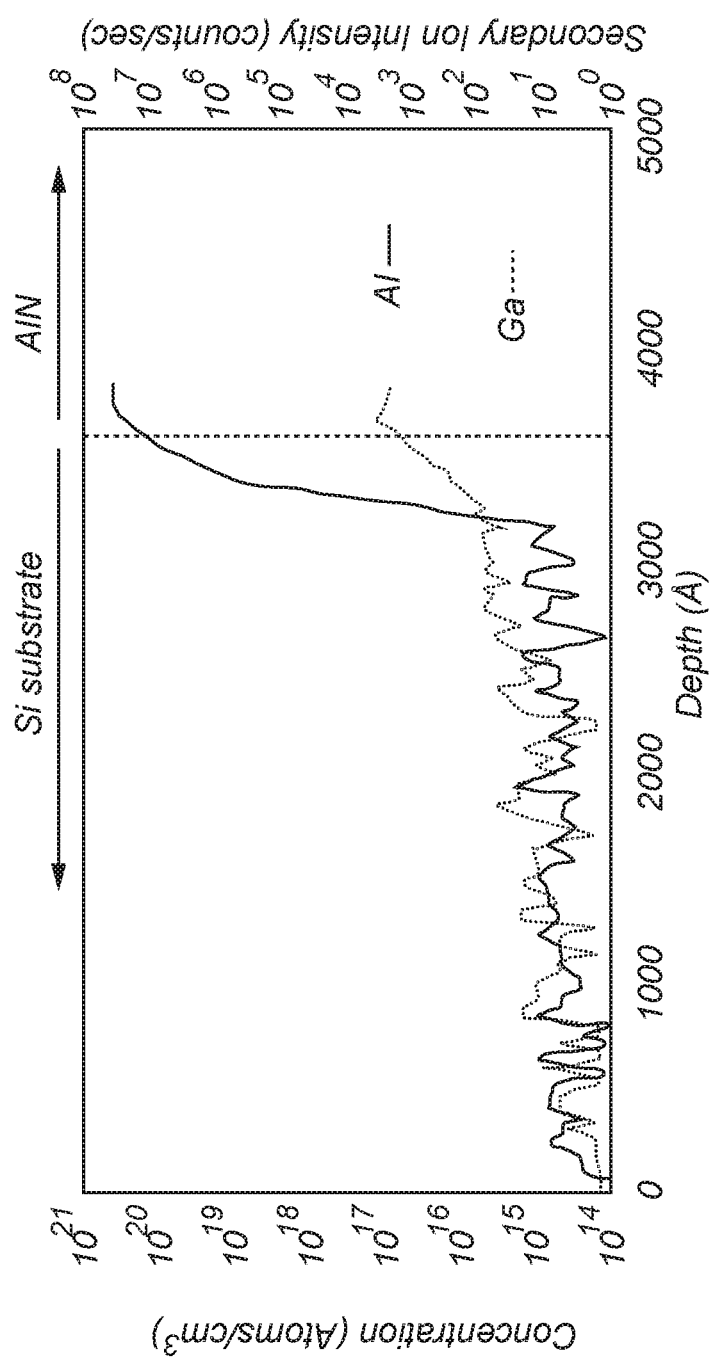
FIG. 3c shows Secondary Ion Mass Spectrometry (SIMS) results where Al and Ga chemical concentration profiles are plotted near an Si/AlN interface of a representative Si-substrate.
Figure 3D:
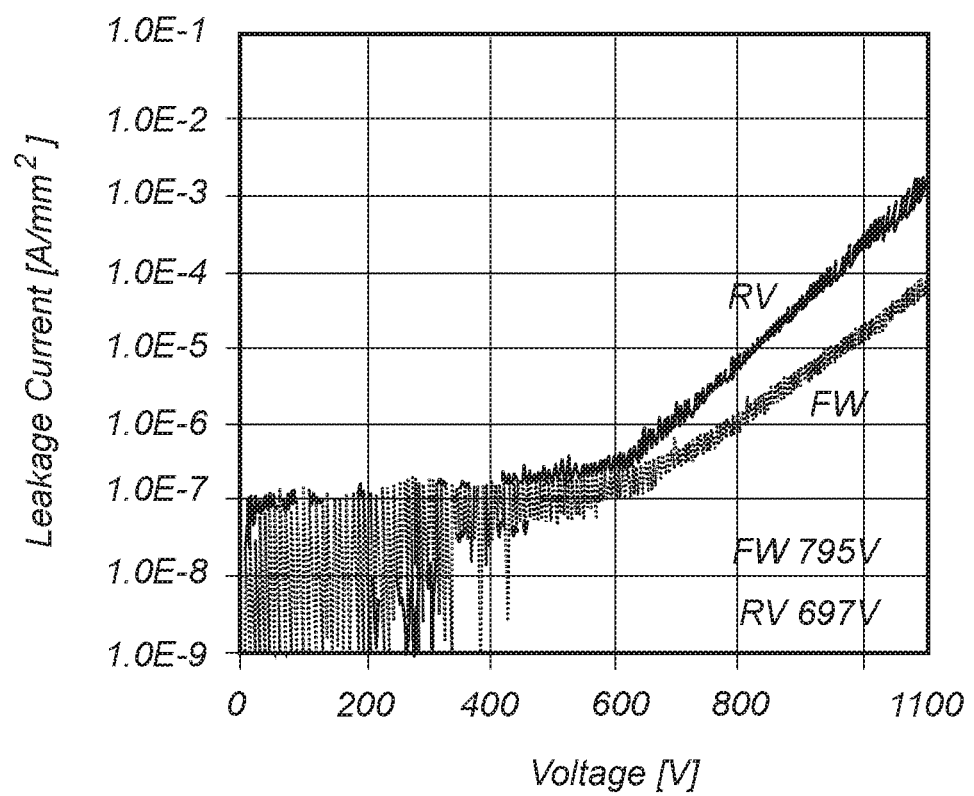
FIG. 3d shows the I-V characteristics of a representative semiconductor structure at room temperature (i.e. 25° C.) where the voltage is applied at the top surface of the channel layer and the Si-substrate being grounded.

FIG. 3d shows the I-V characteristics of the example semiconductor structure 300 at room temperature (i.e. 250C), the voltage being applied at the top surface of the channel layer and the Si-substrate 102 being grounded. The buffer leakage blocking capability $V_{bd}$ can be evaluated with the voltage at the leakage current of 1 μA/mm². For the present structure, the $V_{bd}$ under forward bias amounts to approximately 795 V and under reverse bias to approximately 697 V. These values can be more than sufficient for the typical requirement of ~50V for typical RF devices.

Figure 3E:
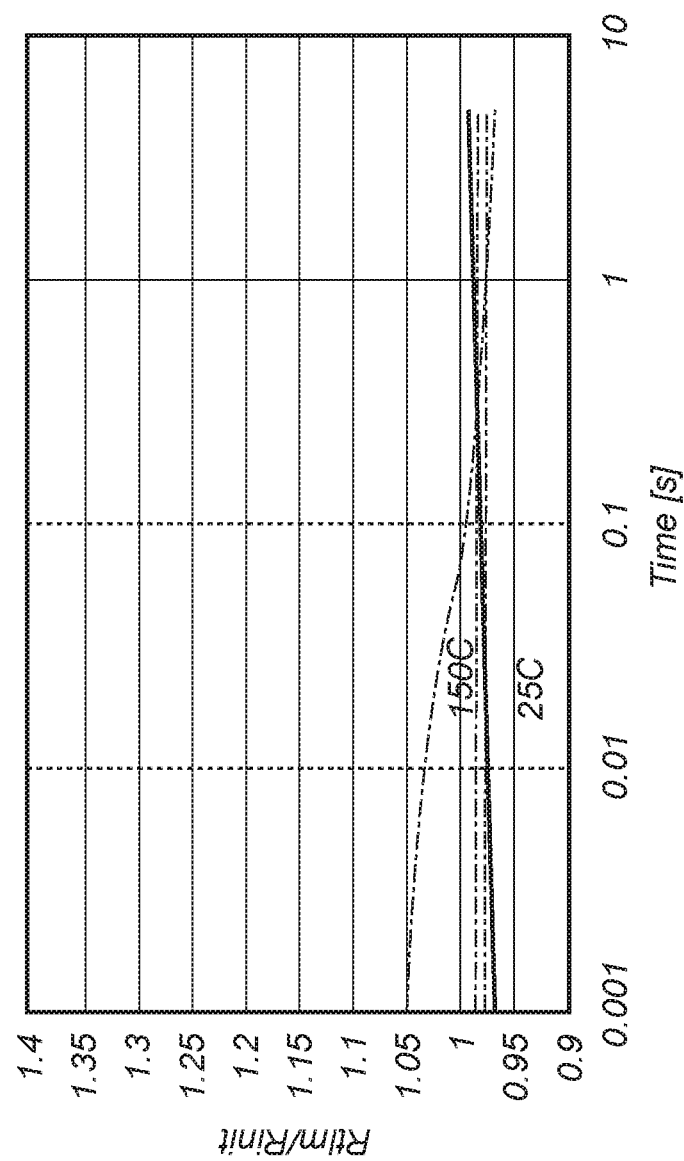
FIG. 3e shows evaluation of a buffer dispersion on a full transistor stack including the semiconductor structure using a so-called "back-gating" measurement. Each curve in the plot was obtained from different semiconductor structures with similar configuration, formed on the sample substrate.

In FIG. 3e, the buffer dispersion may be evaluated on an example full transistor stack including the example semiconductor structure 300 using a so-called "back-gating" measurement. Each curve in the plot was obtained from different semiconductor structures with similar configuration, formed on the sample substrate. On top of the GaN channel layer there can be formed MOCVD deposited a 0.5 nm AlN spacer, a 10 nm $Al_{0.25}GaN$ electron supply layer and a 5 nm $Si_3N_4$ cap layer. In a back-gating measurement, the structure can be stressed by applying a −200 V bias to the substrate 102. The resistance of the conducting channel of the transistor (i.e. the 2D electron gas, 2DEG) may be monitored before and after applying the stress. The buffer dispersion may be estimated as the ratio of resistance after terminating the stressing, Rtlm and before initiating stressing, Rinit. As seen in FIG. 3e, the buffer dispersion can less than 5% at both 25° C. and 150° C.

Figure 4A:
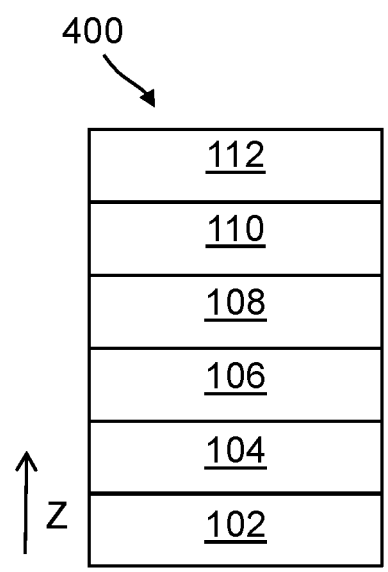
FIG. 4a shows a representative semiconductor structure comprising a 200 mm Si-substrate with a (111) upper surface plane and a resistivity of 500-2000 Ω-cm.

FIG. 4a shows a representative semiconductor structure 400 comprising a 200 mm Si-substrate 102 with a (111) upper surface plane and a resistivity of 500-2000 Ω-cm. The buffer structure may include a 200 nm thick AlN nucleation layer 104 and a 40 nm $Al_{0.3}GaN$ transition layer. The buffer structure may include a superlattice 108 including 30 superlattice units of C-[5 nm AlN/28 nm $Al_{0.1}GaN$] having a carbon concentration of about $2E19$ $cm^{-3}$, and being grown at 940° C. by MOCVD. The buffer structure may include an upper transition layer 110 of 1 μm C—GaN with a carbon concentration of about $2E19$ $cm^{-3}$, and grown by MOCVD at 950° C. Finally, a 300 nm GaN channel layer 112 may be grown at 1040° C. by MOCVD on the buffer structure.

For the semiconductor structure 400, the post epi wafer warp may be about 15 μm and the epi layer may also be substantially free from cracks and pits. The RF loss can be as low as ~0.25 dB/mm at 20 GHz as may be seen in FIG. 4b (where each curve was obtained from different semiconductor structures with similar configuration, formed on the sample substrate). The $V_{bd}$ can be about 350V at room temperature, both under forward and reverse bias conditions (see FIG. 4c). A buffer dispersion of less than about 5% was measured.

Figure 5A:
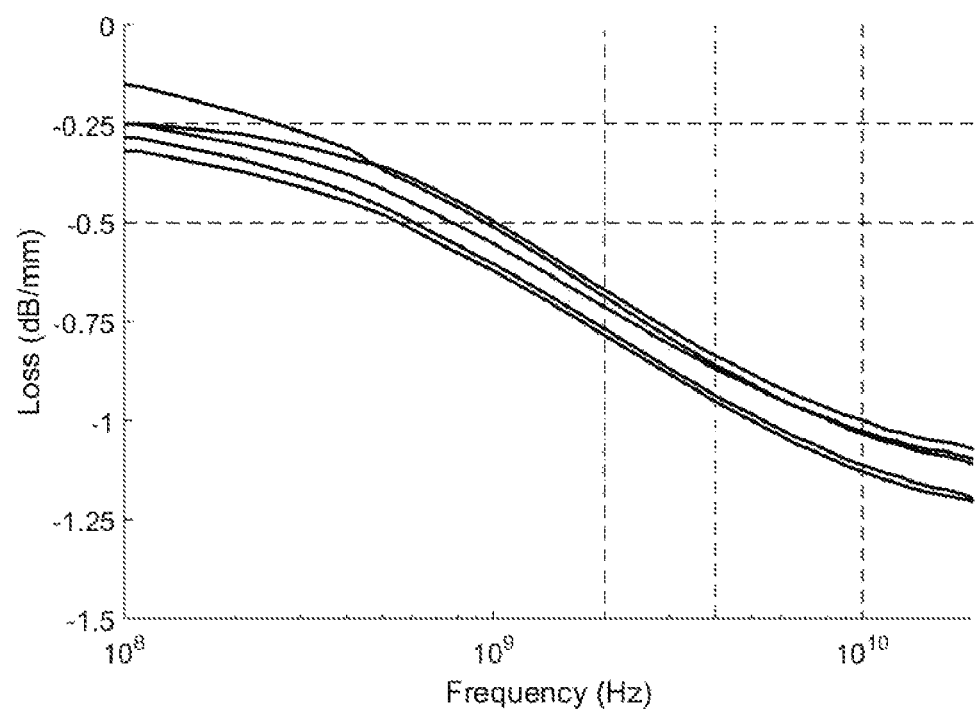
FIGS. 5a and 5b shows measurements results for a semiconductor structure according to a comparative example employing a step-graded buffer scheme. Each curve in FIG. 5a was obtained from different semiconductor structures with similar configuration, formed on the sample substrate.
Figure 5B:
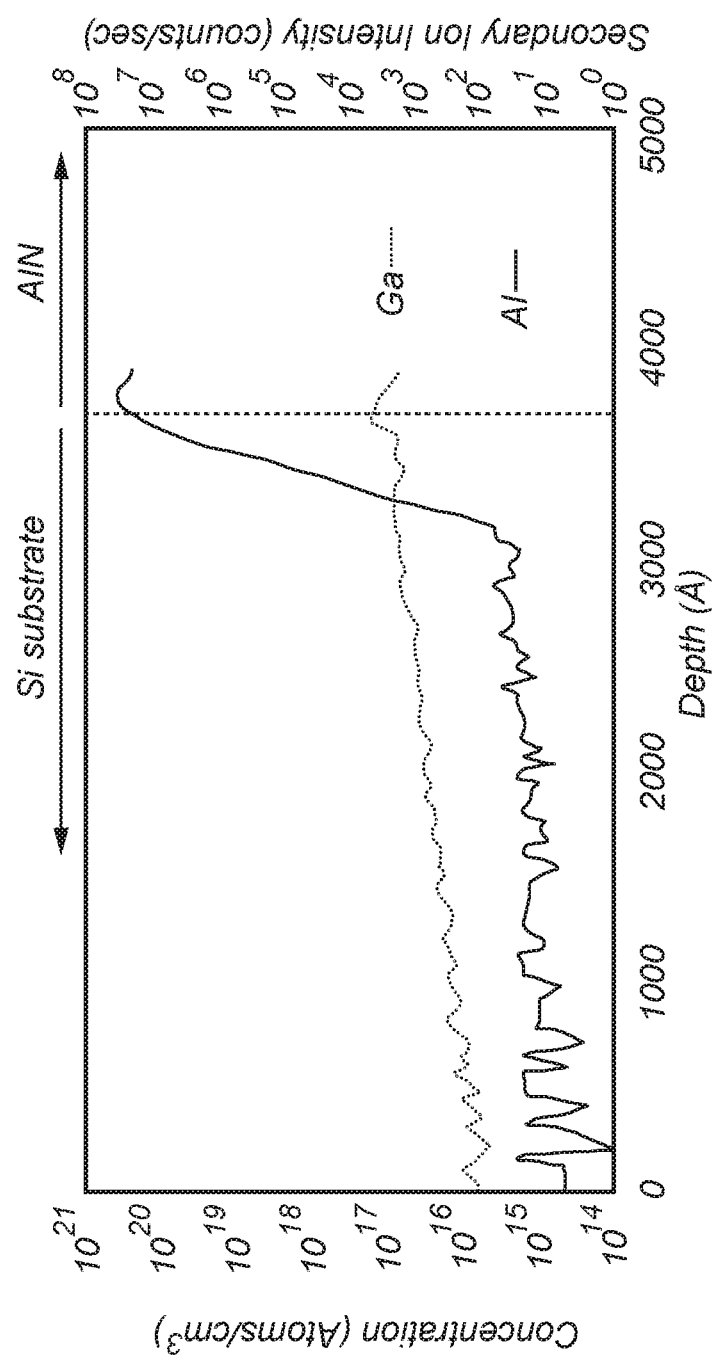

FIGS. 5a and 5b shows measurements results for a semiconductor structure according to a comparative example employing a step-graded buffer scheme. Each curve in FIG. 5a was obtained from different semiconductor structures with similar configuration, formed on the sample substrate. The structure can comprise a 200 mm Si-substrate 102 with a (111) upper surface plane and a resistivity of 500-2000 Ω-cm. A stack including a 200 nm AlN nucleation layer, a 500 nm $Al_{0.75}GaN$ layer, a 500 nm $Al_{0.44}GaN$ layer and a 1.2 μm $Al_{0.08}GaN$ layer can be grown on the substrate. The 1.2 μm $Al_{0.08}GaN$ layer can be grown by MOCVD at 1040° C. On top, a 300 nm GaN layer can be grown by MOCVD at a temperature of 1060° C.

Although the post epi wafer warp can be about 70 µm and the epi layers can be free from crack and pits, the RF transmission loss can be as high as −1.25 dB/mm (see FIG. 5a). This may be attributed to the unfavorably high thermal budget due to the elevated growth temperatures for the $Al_{0.08}GaN$ layer and the top GaN layer. This can be confirmed by the SIMS measurement as shown in FIG. 5b. It can be seen that Al diffuses about 55 nm into the Si-substrate before the concentration drops to the SIMS detection limit of $1E15\ cm^{-3}$. Moreover, there can be a strong and long Ga tail extending deeply into Si-substrate by over 360 nm, with Ga concentration greater than $1E16\ cm^{-3}$. The Al and Ga substrate in-diffusion can be clearly much more pronounced than in the stack 300, as shown in FIG. 3c.

Figure 6:
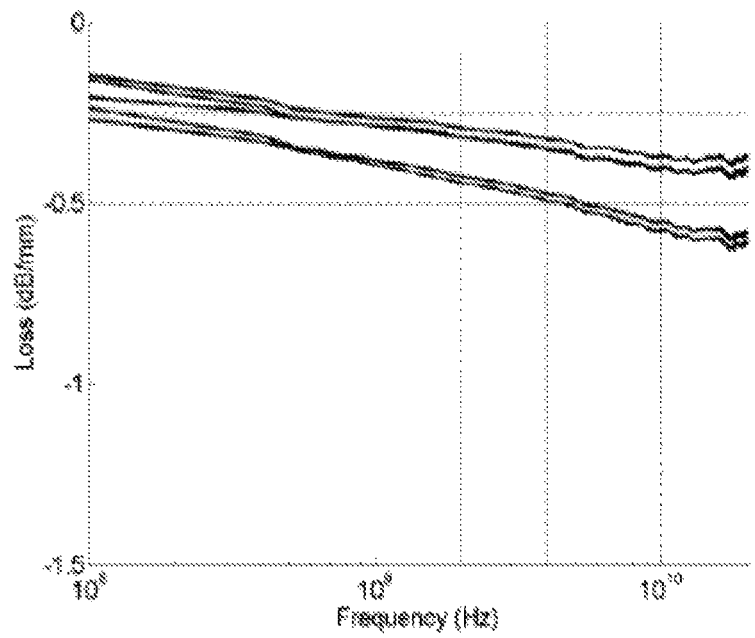
FIG. 6 shows the RF loss for a semiconductor structure according to a comparative example.

FIG. 6 shows the RF loss for a semiconductor structure according to a further comparative example, the structure comprising a stack of a 200 nm AlN nucleation layer, a 359 nm $Al_{0.4}GaN$ layer and a 1 µm GaN layer, the stack grown on a 4" Si (111) substrate with a resistivity of >5000 ohm-cm. The GaN layer can be grown at a temperature of about 1100° C. Again, the elevated growth temperature may be attributed as the reason for the high RF loss of about −0.5 dB/mm at 20 GHz.

Figure 7:
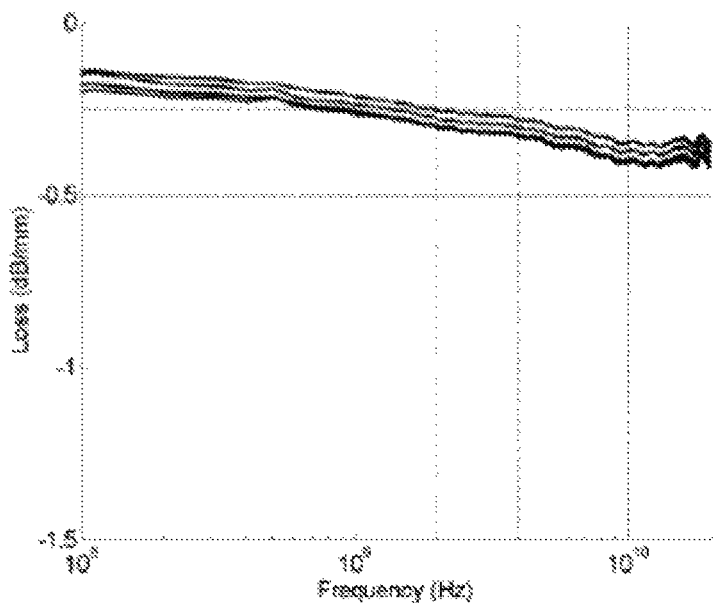
FIG. 7 the RF loss for a semiconductor structure according to another comparative example.

FIG. 7 shows the RF loss for a semiconductor structure according to a further comparative example, the structure comprising a stack of a 200 nm AlN nucleation layer, a 359 nm $Al_{0.4}GaN$ layer, a 0.75 µm GaN layer, and a 150 nm GaN layer, the stack grown on a 4" Si (111) substrate with a resistivity of >5000 ohm-cm. The 0.75 µm GaN layer can be grown by MOCVD at a temperature sufficiently low for allowing auto C-doping. The top 0.15 µm GaN layer can be grown at a temperature of about 1100° C. As a result of the C-doping, the RF loss can be clearly lower at 20 GHz (about −0.4 dB/mm) than in the previous example shown in FIG. 6. However, the buffer dispersion can be about 60% at 25° C. and reaches 1000% at 150° C.

Figure 8:
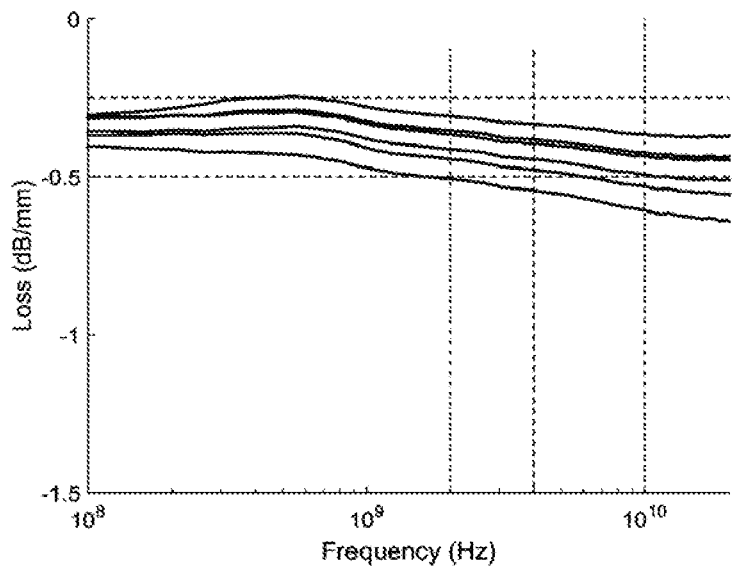
FIG. 8 shows the RF loss for a semiconductor structure according to a further comparative example.

FIG. 8 shows the RF loss for a semiconductor structure according to a further comparative example, the structure comprising a stack of a 200 nm AlN nucleation layer, a 40 nm $Al_{0.3}GaN$ layer, a 0.99 µm superlattice including 30 units of C-[5 nm AlN/28 nm $Al_{0.1}GaN$], grown by MOCVD at a temperature of 940° C. and including a carbon concentration of about 2E19 cm−3, and a 1300 nm GaN layer grown at 1040° C., the stack grown on a Si (111) substrate with a resistivity of 500-2000 Ω-cm.

Figure 9:
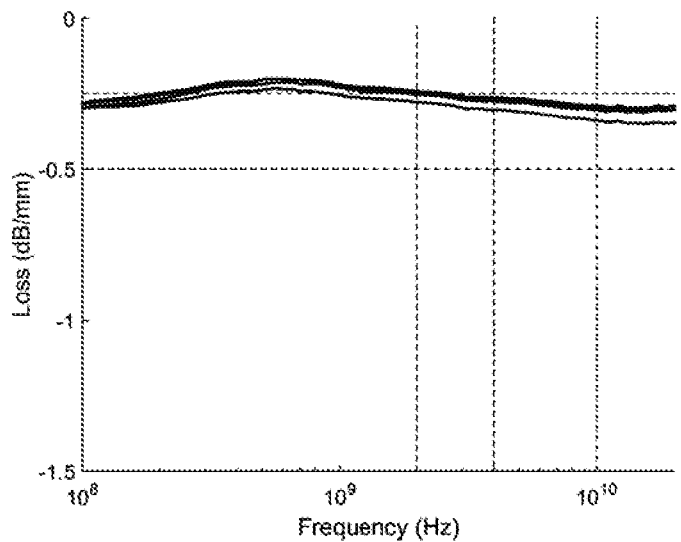
FIG. 9 shows shows the RF loss for an example semiconductor structure formed in accordance with the method of the present disclosure.

FIG. 9 shows the RF loss for an example semiconductor structure formed in accordance with the above described method, the structure comprising a stack of a 200 nm AlN nucleation layer, a 40 nm $Al_{0.3}GaN$ layer, a 0.99 µm superlattice including 30 units of C-[5 nm AlN/28 nm $Al_{0.1}GaN$], grown by MOCVD at a temperature of 940° C. and including a carbon concentration of about $2E19\ cm^{-3}$, a 0.5 µm C—GaN layer grown at 950° C. and including a carbon concentration of about $2E19\ cm^{-3}$, and a 800 nm GaN layer grown at 1040° C., the stack grown on a Si (111) substrate with a resistivity of 500-2000 Ω-cm.

In each of FIGS. 6-9, each curve in the respective plots was obtained from different semiconductor structures with similar configuration, formed on the sample substrate.

Comparing the RF loss in FIGS. 8 and 9, the effect of controlling the total buffer thermal budget on the RF transmission loss may be seen. For the structure represented in FIG. 8, the top GaN channel layer can be grown to a thickness of 1300 nm at a temperature of 1040° C. Meanwhile, for the structure represented in FIG. 9, a 500 nm C—GaN layer can be grown at a lower temperature of 950° C. and an 800 nm top GaN layer can be grown at a temperature of 1040° C. The total thickness of GaN layers in the structures can be accordingly equal. However, due to the lower total thermal budget for the growth of the 500 nm C—GaN layer and 800 nm GaN layer, lower RF losses can result.

Figure 4B:
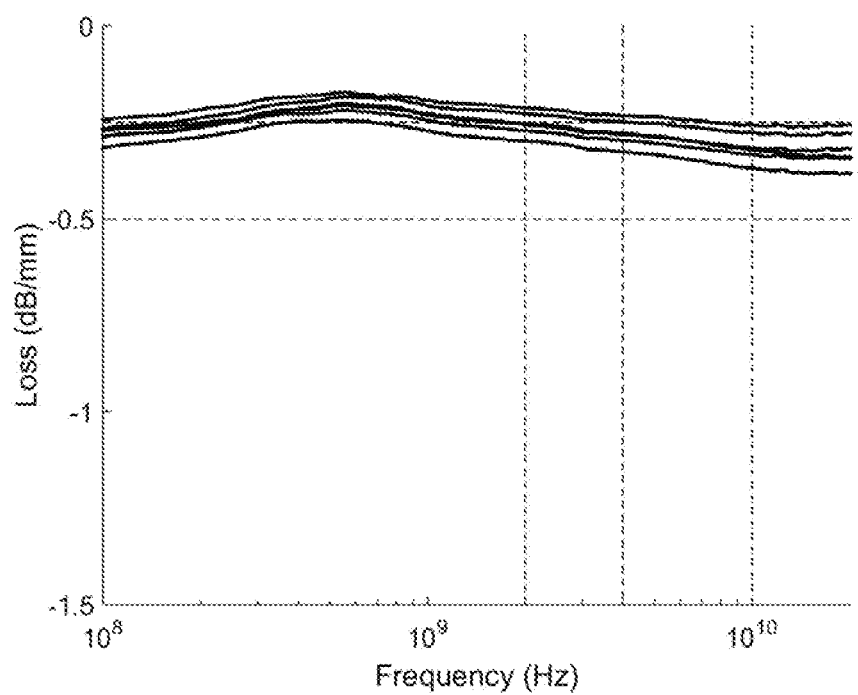
FIG. 4b shows RF loss curves obtained from different representative semiconductor structures with similar configuration, formed on the sample substrate).
Figure 4C:
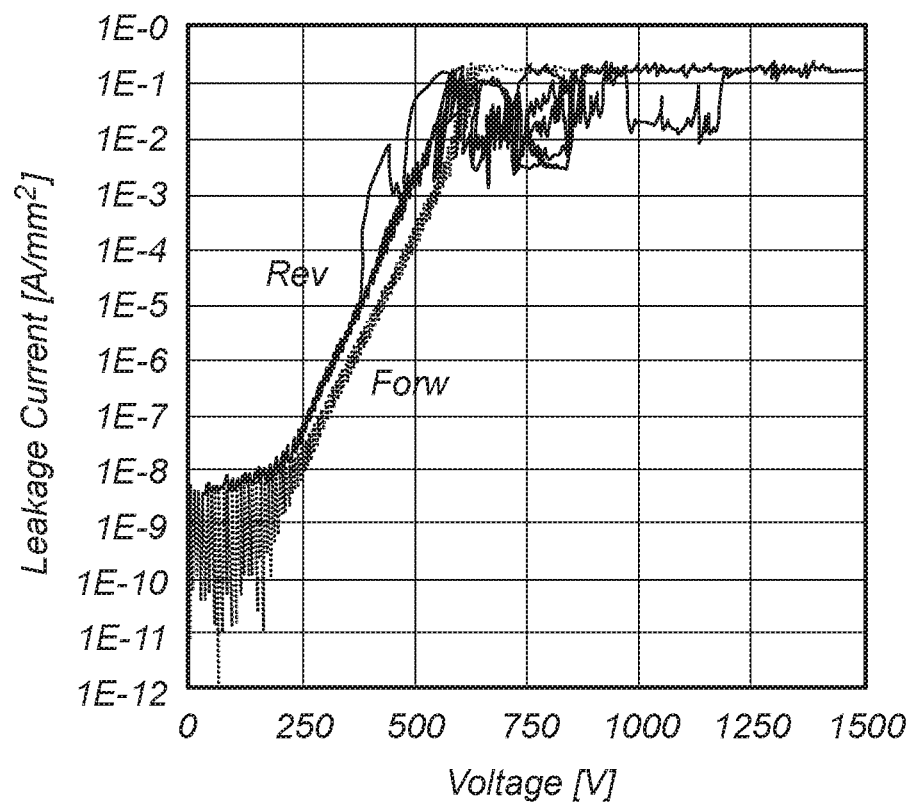
FIG. 4c shows the V$_{bd}$ of a representative semiconductor structure may be about 350V at room temperature, both under forward and reverse bias conditions.
Figure 10:
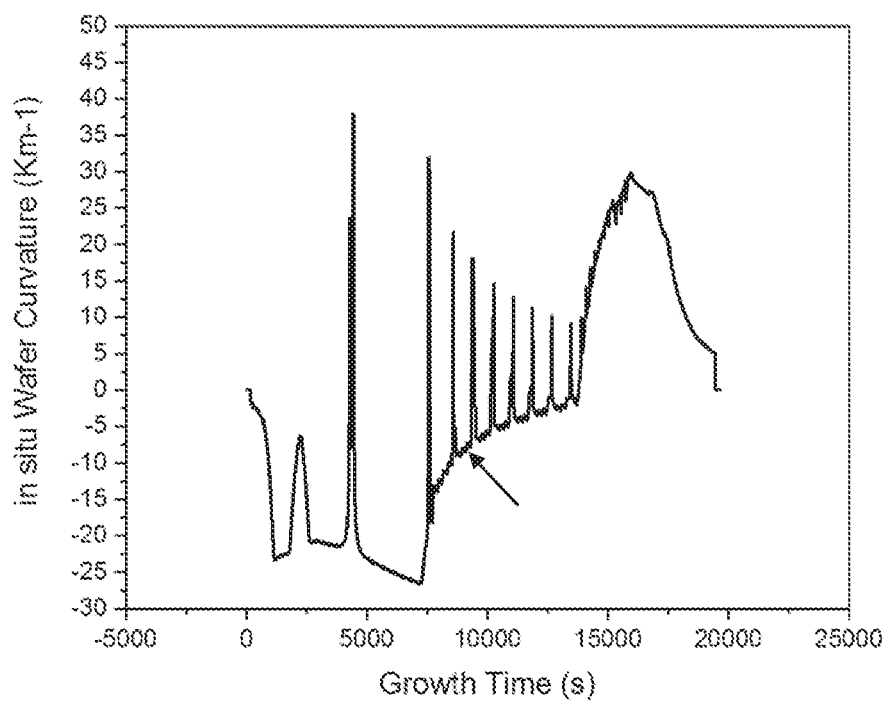
FIG. 10 shows a plot of an in-situ wafer curvature of the buffer structure discussed in connection with FIGS. 4a to 4c.

FIG. 10 shows a plot of an in-situ wafer curvature of the buffer structure 400 discussed in connection with FIGS. 4a to 4c. The sharp spikes and short range high frequency oscillations of the curves can be the artefacts of the measurement system. The arrow indicates the point in time where the slope of the wafer in situ curvature appreciably decreases. As may be seen in FIG. 10, the addition of superlattice units can be continued at least until the slope of the in situ wafer curvature drops below $0.015\ km^{-1}/s$. The precise thickness where this occurs may depend on the average aluminum content of as well as the layer structure of the said superlattice laminate.

It should be noted that FIG. 10 merely represents one example and that the growth of the buffer structure may be performed such that an at least partial in-plane strain relaxation occurs between one adjacent pair of layers within a lower, middle or top portion of a first or a second superlattice block. Said pair may include a lower layer and an upper layer formed on the lower layer wherein the upper layer, during the growth of the buffer structure, may become or may be formed to be at least partially strain relaxed with respect to the lower layer. The strain relaxation may be achieved for instance by growing the upper layer to a thickness exceeding a critical layer thickness. Alternatively, the upper layer may be grown as a pseudomorphic layer (i.e. thinner than the critical thickness) and subsequently, following growth of further layers on top, become partially strain relaxed. Strain relaxation may occur at one or more positions within one or more superlattice blocks. All other layers of the superlattice block(s) may form pseudomorphic layers.

Following completion and cooling of the structure, an at least partial strain relaxation may be present in the buffer structure, between (at least) said lower and adjacent upper layer. The lattice mismatch induced in-plane strain f for an adjacent lower and upper layer may be defined as $f=(c_L-c_U)/c_U$, where $c_L$ is the in-plane lattice constant of the lower layer and cu is the relaxed in-plane lattice constant of the upper layer. For a pseudomorphic upper layer, the in-plane lattice constant of the upper layer matches the in-plane lattice constant of the lower layer.

The present disclosure has mainly been described with reference to a limited number of examples. However, as may be readily appreciated by a person skilled in the art, other examples than the ones disclosed above are equally possible within the scope of the disclosure, as defined by the appended claims.

The invention claimed is:

1. A method of forming a semiconductor structure for a III-N semiconductor channel device, the method comprising:
    forming a buffer structure on a Si-substrate, wherein forming said buffer structure comprises:
        forming a nucleation layer of AlN on the Si-substrate;
        forming a lower transition layer of (Al)GaN on the nucleation layer;
        forming a superlattice on said lower transition layer, said superlattice comprising at least one superlattice block, each superlattice block comprising a repetitive sequence of superlattice units, each superlattice unit comprising a plurality of layers, said plurality of layers comprising a first layer and a second layer formed on said first layer, wherein said first layer is a carbon-doped $Al_xGa_{1-x}N$ layer and said second layer is a carbon-doped $Al_yGa_{1-y}N$ layer, wherein x and y differ from each other, $0 \leq x \leq 1$ and $0 \leq y \leq 1$, wherein said first layer and second layer is epitaxially grown at a temperature of 980° C. or lower and wherein the first layer and the second layer have a carbon-doping concentration ranging from $10^{19} cm^{-3}$ to $10^{20} cm^{-3}$; and forming an upper transition layer of carbon-doped GaN on said superlattice, wherein the carbon-doped GaN has a carbon-doping concentration ranging from $10^{19} cm^{-3}$ to $10^{20} cm^{-3}$; and forming a III-N semiconductor channel layer on said upper transition layer of said buffer structure, wherein said channel layer is epitaxially grown at a temperature ranging from 1010° C. to 1040° C. and is grown to a thickness of 1 μm or smaller.

2. The method according to claim 1, wherein said first and second layers are epitaxially grown at a temperature of 950° C. or lower.

3. The method according to claim 1, wherein said each superlattice unit of said at least one superlattice block further comprises a third layer formed on said second layer, wherein said third layer is an $Al_zGa_{1-z}N$ layer, where z differs from x and y and $0 \leq z \leq 1$.

4. The method according to claim 1, wherein said first layer and said second layer of said superlattice units are grown by metal-organic chemical vapor deposition (MOCVD).

5. The method according to claim 1, wherein said channel layer is formed with a thickness ranging from 0.1 to 1 μm.

6. The method according to claim 1, wherein said channel layer is grown by MOCVD.

7. The method according to claim 1, wherein said upper transition layer is epitaxially grown at a temperature of 980° C. or lower.

8. The method according to claim 1, wherein said upper transition layer is grown by MOCVD.

9. The method according to claim 1, wherein said Si-substrate presents a resistivity of 500 ohm-cm or greater.

10. The method according to claim 1, wherein said channel layer is formed of $B_xIn_yAl_zGa_wN$ ($0 \leq x \leq 1$, $0 \leq y \leq 1$; $0 \leq z \leq 1$, $0 \leq w \leq 1$, and $x+y+z+w=1$).

11. The method according to claim 10, wherein the channel layer is GaN.

12. The method according to claim 1, further comprising forming an electron supply layer on the channel layer.

13. The method according to claim 12, wherein said electron supply layer is formed of $B_aIn_bAl_cGa_dN$ ($0 \leq a \leq 1$, $0 \leq b \leq 1$; $0 \leq c \leq 1$, $0 \leq d \leq 1$, and $a+b+c+d=1$).

14. The method according to claim 12, further comprising forming a spacer layer between said channel layer and said electron supply layer.

15. The method according to claim 12, further comprising forming a cap layer on said electron supply layer.

* * * * *